United States Patent [19]
Takane et al.

[11] Patent Number: 5,148,109
[45] Date of Patent: Sep. 15, 1992

[54] MAGNETIC RESONANCE IMAGING METHOD AND SYSTEM THEREFOR

[75] Inventors: Atsushi Takane; Yoshiyuki Miyamoto, both of Katsuta; Ryuzaburo Takeda, Mito; Koichi Sano, Sagamihara, all of Japan

[73] Assignee: Hitachi, Ltd., Tokyo, Japan

[21] Appl. No.: 579,531

[22] Filed: Sep. 10, 1990

[30] Foreign Application Priority Data

Sep. 13, 1989 [JP] Japan .................. 1-235678

[51] Int. Cl.⁵ .......................................... G01R 33/20
[52] U.S. Cl. .................................................. 324/309
[58] Field of Search ................. 324/300, 307, 309; 128/653 R, 653 A

[56] References Cited

U.S. PATENT DOCUMENTS 4,521,733  6/1985  Bottomley et al. ............... 324/309
4,613,949  9/1986  Glover et al. ..................... 324/309

Primary Examiner—Michael J. Tokar
Attorney, Agent, or Firm—Antonelli, Terry, Stout & Kraus

[57] ABSTRACT

A spin in a predetermined voxel of the brain surface is excited to cause the spin to perform steady state free precession which causes signals, of which a time-reversed FID signal relating to spin-spin relaxation time T2 is enhanced to form an image representative of a thickness of cerebrospinal fluid existent in the brain surface, that is, of a brain surface structure. The spin can be caused to perform the steady state free precession by applying a pulse at the rate of a short repetition time and therefore an image of the brain surface can be obtained within a short period of time.

14 Claims, 2 Drawing Sheets

MAGNETIC RESONANCE IMAGING METHOD AND SYSTEM THEREFOR

BACKGROUND OF THE INVENTION

The present invention relates to a computer tomography system utilizing nuclear magnetic resonance phenomenon and more particularly to a magnetic resonance imaging (MRI) system effective to form an image of a brain surface structure at high speeds.

As a method of imaging the brain surface structure by using the MRI system, a surface anatomy scanning (SAS) method has been available. For reference, MR Imaging of Brain Surface Structures by K. Katada et al, Japanese Journal of Magnetic Resonance in Medicine, Vol. 9, No. 3 (1989) should be noted.

The SAS method takes advantage of the fact that cerebrospinal fluid (CSF) existent in the brain surface has a spin-spin relaxation time T2 longer than that of the other portion of the brain Specifically, the T2 is highly enhanced to obtain a signal from only the cerebrospinal fluid and the thus obtained signal is used for formation of an image of the brain surface structure. More particularly, the formation of an image of the brain surface structure is accomplished by utilizing the contrast between a signal obtained from a portion where the CSF layer is thick and a portion where the CSF comes into cerebral sulci and fissures and a signal obtained from a portion where the CSF layer is thin and a portion of convolution or gyrus.

For enhancement of the T2, the aforementioned SAS method uses the so-called long spin echo method. Accordingly, it takes a long time to complete measurement. For example, given that the pulse repetition time TR was 2000ms, the echo time TE was 250ms and the frequency of excitation (the number of signal averages) was 2, the time required for signal acquisition was 17 minutes.

Conventionally, as a method of obtaining an echo corresponding to a spin-spin relaxation time T2 within a short period of time, the so-called gradient echo method has been known. For reference, Journal of Magnetic Resonance 62, 12–18 (1985) and magnetic Resonance in Medicine 7, 35–42 (1988) should be noted.

SUMMARY OF THE INVENTION

An object of the present invention is to obtain an imaging method and a system therefor (MRI system) capable of forming an image of a brain surface structure within a short period of time.

According to the invention, the above object can be accomplished by enhancing T2 through the use of the gradient echo method to decrease the time for image formation.

More particularly, an RF pulse for excitation is applied at the rate of repetition time which is much shorter than the spin-lattice relaxation time and spin-spin relaxation time in an object to be imaged, causing a spin in the object region to perform steady state free precession (SSFP) and a signal developing at that time immediately before an RF pulse, that is, a time-reversed signal is acquired and sampled in the form of an echo by applying a gradient field of inversed polarity after a frequency encoding gradient field.

Another object of the invention is to provide imaging conditions for making sharp an image of a brain surface structure imaged through the use of the gradient echo method.

DESCRIPTION OF THE PREFERRED EMBODIMENTS

Figure 1:
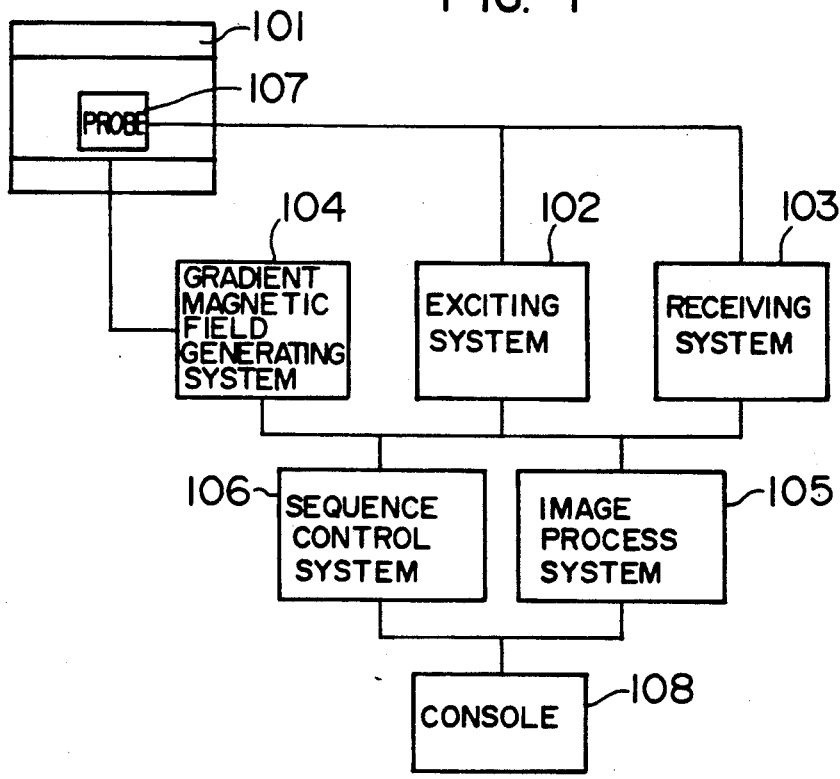
FIG. 1 is a block diagram illustrating a magnetic imaging (MRI) system to which imaging method of the invention is applied.

The invention will now be described by way of example with reference to the accompanying drawings. FIG. 1 schematically shows, in block form, the construction of an MRI system according to an embodiment of the invention. Referring to FIG. 1, reference numeral 101 designates a magnet for generating a uniform static magnetic field, 102 an exciting system for generating an RF magnetic field used to cause nuclear magnetic resonance in a human body to be examined, 103 a receiving system for receiving and detecting an electromagnetic wave generated from the examined object and thereafter subjecting the detected signal to A/D conversion, 104 a gradient magnetic field generating system which can change the magnetic field intensity in X, Y and Z directions respectively and independently, 105 an image process system for performing various operations necessary for reconstruction of an image on the basis of measurement data from the measurement system, 106 a sequence control system for controlling operation timings for the individual systems in the above construction, 107 a probe used for transmission and reception of RF waves and 108 a console used for conducting operations.

Figure 2:
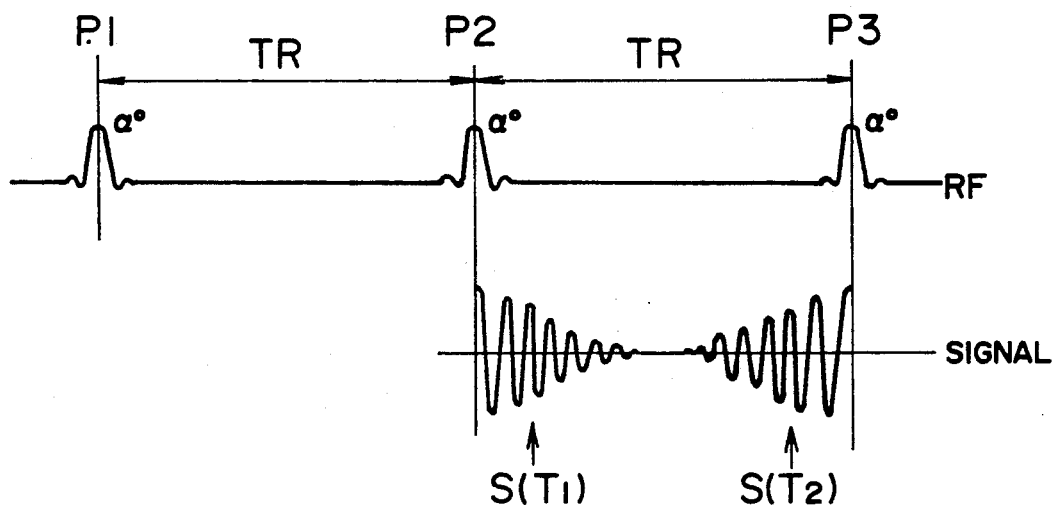
FIG. 2 a time chart showing signals due to SSFP caused RF pulse is applied at the rate of a repetition time which is much shorter than the spin-lattice relaxation time and spin-spin relaxation time in a region to be imaged.

FIG. 2 illustrates a signal S(T2) due to steady state free precession (SSFP) and which corresponds to spin-spin relaxation time T2. This signal S(T2) is used as a signal for enhancing the spin-spin relaxation time T2 in accordance with the present invention.

In order to obtain an echo representative of T2 from the brain surface in accordance with the long spin echo method as in the prior art, a 90° pulse and a 180° pulse are applied at a predetermined interval of time. According to the present embodiment, on the other hand, a pulse for rotating, for example by $\alpha°$ about the X-axis, a spin aligned in the Z-direction by a slice gradient field is applied at the rate of a predetermined repetition time TR as shown in FIG. 2. Then, pulses P1 and P2 mutually affect to cause, immediately before a pulse P3, a time-reversed free induction decay (FID) signal S(T2) enhancing the spin-spin relaxation time T2. The flip angle $\alpha°$ may be set to a desired value.

A signal S(T1) enhancing the spin-lattice relaxation time T1 develops immediately after the pulse P2.

The repetition time TR is much shorter than the spin-lattice relaxation time T1 of cerebrospinal fluid and the echo time TE may preferably be 50 to 90% of TR. The influence of one, S(T1), of the FID signals (see FIG. 2) disadvantageously tends to be predominant if the ratio TE/TR is not greater than 50%, while design of pulse sequence faces much difficulties if the ratio TE/TR exceeds 90%. Thus, the correlation between the pulse timing for the slice gradient field and that for the frequency encoding gradient field prescribes the echo time TE.

Figure 3:
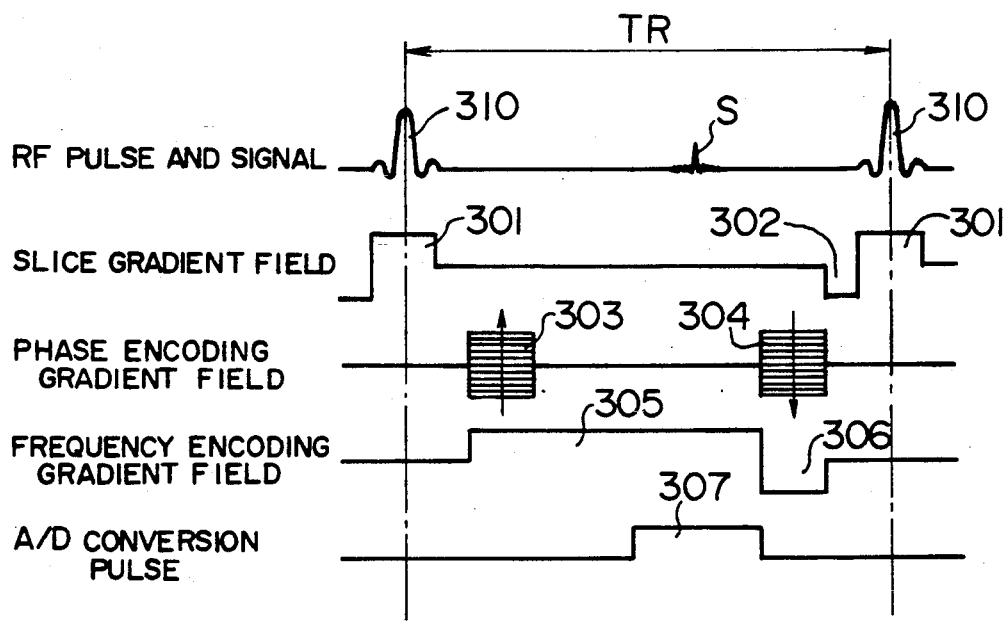
FIG. 3 is a time chart showing an embodiment of pulse sequence the MRI system.
Figure 4:
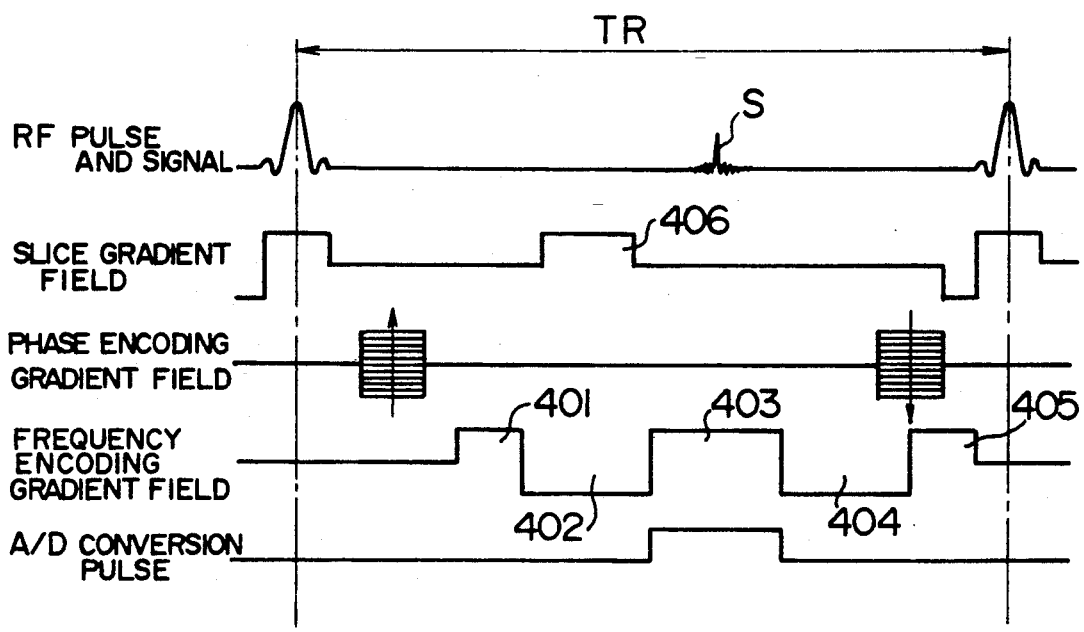
FIG. 4 is a time chart showing another embodiment of pulse sequence in the MRI system.

Referring now to FIGS. 3 and 4, there are illustrated embodiments of pulse sequence for implementation of the present invention. In particular, the sequence shown in FIG. 3 is for sampling a signal developing immediately before an RF pulse and forming an image of a brain surface structure. A region which is sufficient to contain a brain surface to be pictured is selected by a field 301 through slice selection and is excited by an RF pulse 310 of a desired angle. A negative-going portion 302 is effective to return the phase disturbed in the slice direction by the field 301. The RF pulse 310 for excitation is applied at the rate of a repetition time TR which is much shorter than the spin-lattice relaxation time and spin-spin relaxation time in the region to be imaged, causing a signal S immediately before an RF pulse. The signal S is acquired by bipolar gradient fields 305 and 306 to provide an echo signal which is subjected to A/D sampling in synchronism with a pulse 307.

Polarities of the two gradient fields 305 and 306 are inverted at chained line shown in FIG. 3 to follow the frequency encoding gradient field. In order to dephase a signal immediately after an RF pulse, the field 305 may be applied before sampling at the pulse 307. The above procedure is measured within the same phase encoding projection defined by phase encoding gradient fields 303 and 304. The gradient field 304 is of the same intensity and of inversed polarity relative to the field 303 so that the phase rotation due to the field 303 may be returned to the original. The phase encoding projection defined by fields 303 and 304 is changed to obtain an image picturing a brain surface structure from the signal sampled at the pulse 307.

In another embodiment shown in FIG. 4, linear moment of a grodient field caused by a bipolar graident field is made to be zero. When bipolar fields such as 306, 307 and 307, 308 shown in FIG. 3 are applied, the linear term obtained by expanding spin motion by time, that is, the velocity term causes phase rotation. A proportional constant of the phase rotation complying with the velocity at that time is called the linear moment. Any objects caused by the linear moment to have velocity as represented by blood flow and body motion cause the phase rotation which results in artifacts. The artifacts can be nullified by continuously applying a bipolar gradient field in reversed order of application to the bipolar gradient field responsible for the generation of the linear moment. This expedient is applied to provide a gradient field application pattern as indicated by 401 to 405 which is called a phase insensitive state. A gradient field 406 is effective to dephase the unwanted signal. The phase insensitive state may also be established in the slice-axis direction.

For reference, Journal of Computer Assisted Tomography 10(5), 715–722 and Radiology, 1986; 161: 717–720 should be noted.

Imaging conditions in each embodiment are as follows:

| FoV: | 250 (mm) |
| --- | --- |
| TR/TE: | 100/82 (ms) |
| Flip angle: | 60° |
| Slice thickness: | 100 (mm) |
| Matrix: | 256 × 256 |

| -continued | |
| --- | --- |
| Frequencies of excitation: | 2 |
| Imaging time: | 51 sec. |

The above data demonstrates that the imaging time in the present embodiment is reduced to 1/20 of the imaging time in the prior art method based on the long spin echo method (17 minutes are required for imaging).

The above imaging conditions are the fruits of untiring, thorough studies of the present inventors. Especially, by setting the ratio TR/TE and flip angle to the above values, the sharpness of image can be maximized.

The present invention is in no way limited to the foregoing embodiments but it is to be understood that the range within which the embodiments can be changed easily by those skilled in the art, that is, the same technical idea resides in the framework of the present invention.

We claim:

1. A method for imaging a brain surface structure utilizing a MRI system, comprising the steps of:
   selecting a pixel to be imaged at a brain surface of the brain surface structure;
   acquiring a time-reversed fee induction decay (FID) signal which corresponds to an enhanced spin-spin relaxation time (T2) from the pixel to be imaged by using a gradient echo method; and
   imaging the brain surface structure in accordance with the signal.

2. A method according to claim 1, wherein the gradient echo method is performed by applying RF pulses for excitation to be cerebrospinal fluid on the pixel to be imaged at a repetition time (TR) which is substantially shorter than the spin-spin relaxation time (T2) and a spin-lattice relaxation time (T1) of the cerebrospinal fluid, and establishing a steady state free precession (SSFP) in the pixel so as to enable the time-reversed FID signal.

3. A method according to claim 2, wherein the signal is acquired at a time immediately before application of a subsequent RF pulse.

4. A method according to claim 3, wherein a ratio TE/TR is within a range of 50 to 90%, where TE represents an echo time which is a time between an nth RF pulse and an nth signal.

5. A method according to claim 4, wherein the ratio of TE/TR is about 82%, and a flip angle of the RF pulses is about 60°.

6. A method according to claim 3, wherein a frequency encoding gradient field is applied to the pixel to be imaged, and the signal is acquired by applying a gradient field of inverted polarity after a frequency encoding gradient field.

7. A method according to claim 6, wherein phase encoding gradient fields are further applied to the pixel to be imaged.

8. A method according to claim 7, wherein the signal is acquired under the condition that a linear moment caused by said gradient fields is nullified.

9. A method according to claim 8, wherein a gradient field for dephasing is applied to the pixel to be imaged to eliminate artifacts.

10. A nuclear magnetic resonance imaging system for imaging a brain surface structure comprising:
    means for applying a gradient echo method for selecting a pixel to be imaged at a brain surface of the brain surface structure and for acquiring a time-reversed free induction decay (FID) signal corresponding to an enhanced spin-spin relaxation time (T2) from the pixel to be imaged; and means for imaging the brain surface structure in accordance with the signal.

11. A nuclear magnetic resonance imaging system according to claim 10, wherein the means for applying the gradient echo method includes means for applying RF pulses for excitation to a cerebrospinal fluid on the pixel to be imaged at a repetition time (TR) which is substantially shorter than the spin-spin relaxation time (T2) and a spin-lattice relaxation time (T1) of the cerebrospinal fluid so as to establish a steady state free precession (SSFP) in the pixel and to enable the time-reverse FID signal.

12. A nuclear magnetic resonance imaging system according to claim 11, wherein the means for selecting and for acquiring enable acquiring of the signal at a time immediately before application of a subsequent RF pulse.

13. A nuclear magnetic resonance imaging system according to claim 12, wherein the means for selecting and acquiring provide a ratio RE/TR within a range of 50-90%, where TE represents an echo time which is a time between an nth RF pulse and an nth signal.

14. A nuclear magnetic resonance imaging system according to claim 13, wherein the ratio of TE/TR is about 82%, and the means for applying RF pulses apply the RF pulses with a flip angle of about 60°.

* * * * *